United States Patent [19]

Meisel et al.

[11] Patent Number: 4,618,923

[45] Date of Patent: Oct. 21, 1986

[54] DIRECT CURRENT TIGHT COUPLING

[75] Inventors: Michael Meisel, Dormitz, Austria; Heinz Wiendl, Nuremburg, Fed. Rep. of Germany

[73] Assignee: Siemens Aktiengesellschaft, Munich and Berlin, Fed. Rep. of Germany

[21] Appl. No.: 682,899

[22] Filed: Dec. 18, 1984

[30] Foreign Application Priority Data

Feb. 6, 1984 [DE] Fed. Rep. of Germany ....... 3404076

[51] Int. Cl.[4] .......................... H02J 3/36; H02M 7/00
[52] U.S. Cl. ........................................ 363/144; 363/35
[58] Field of Search .................... 363/13, 35, 37, 68, 363/144

[56] References Cited

U.S. PATENT DOCUMENTS 4,090,233 5/1978 Thiele et al. ........................ 363/68
4,318,169 3/1982 Olsson .............................. 363/144 X Primary Examiner—Peter S. Wong
Attorney, Agent, or Firm—F. W. Powers; J. L. James

[57] ABSTRACT

A direct current tight coupling is provided for connecting two asynchronous high-voltage three-phase power systems which includes a three-phase full-wave static converter assembly assigned to each of the power systems to be connected, with static converter transformers and controllable semiconductors, which are controlled by a central electronic control unit so that the input-side static converter assembly functions as a rectifier and the output-side static converter assembly as an inverter. The controllable semiconductors of a functional group are mounted atop each other forming identical static converter towers. The towers are connected together at the same pole on the d.c. side and on the three-phase side with the assigned Wye- and Delta-connected secondary sides of the static converter transformers. Each of the full-wave semiconductor subassemblies assigned to the four secondary sides of the static converter transformers form a static converter tower.

2 Claims, 5 Drawing Figures

DIRECT CURRENT TIGHT COUPLING

BACKGROUND OF THE INVENTION

This invention relates to a direct current tight coupling to connect two asynchronous high-voltage three-phase power systems.

To permit power exchange between two systems with differing frequencies (asynchronous systems), one often uses an isolated d.c. circuit in the form of a three-phase—d.c.—three-phase converter between the two power systems. Since the high-voltage d.c. transmission takes place practically at zero distance, this d.c. circuit is described as a "d.c. tight coupling" or a d.c. short coupling.

Such a d.c. tight coupling connecting two asynchronous high-voltage power systems is described in the "Osterreichische Zeitschrift fuer Electrizitaetswirtschaft" (Austrian Journal for the Electrical Industry), volume 36, issue 8/9, pages 265 and following. It comprises primarily two three-phase full-wave static converter assemblies, interconnected on the d.c. side and connected on the three-phase side to both power systems, which, instead of having passive rectifier valves, contain controllable rectifier components (thyristors). This is necessary because the power exchange between the two coupled systems should selectively occur in both directions. For that purpose, the static converter unit allocated to the feeding power system has to function as a rectifier, while the one allocated to the supply network has to function as an inverter. As the mode of operation thus only depends upon the polarity of the static converter voltages, the transmission setup and the extent of the energy flow are determined by the control of the system exclusively and practically independent of the voltage and frequency relationships in the connected three-phase power systems. A prerequisite is the presence of a central thyristor electronic unit, wherein each thyristor is allocated a thyristor electronic subassembly consisting of an output unit to generate and transmit an electronic ignition pulse as well as an information processing electronic component and a signal transfer unit. The signal transfer itself takes place by means of photoconductor or fiber-optic cables for a variety of reasons which, however, are irrelevant to this particular invention.

In the known high-voltage d.c. tight couplings there are always two static converter transformers each, of whose secondary sides one is Wye-connected and the other Delta-connected, operating onto a three-phase full-wave rectifier with twelve semiconductor rectifier components. Each phase of the three secondary three-phase circuits of both static converter transformers is thus allocated two semiconductor components connected in series so that four semiconductor components form one semiconductor subassembly. Each semiconductor component, in turn, consists of two series-connected thyristors. These eight thyristors are generally arranged one atop the other and together form a so-called valve tower. The existing systems thus consist of a total of six valve towers mounted in a so-called valve housing. Each of these valve towers is connected on the a.c. side with one secondary phase connection each of the two allocated static converter transformers and via a d.c. bus each with the two other valve towers allocated to the respective power system.

Since the four static converter transformers are generally mounted on the outside of the valve housing, two each to its two longitudinal sides, and each of the two transformers has to be connected by a line to each of the three valve towers, there is a massive number of high-voltage connecting lines crossing each other, resulting in a correspondingly large spatial requirement. In addition, each of the three adjoining valve towers of one power system has to be connected to the corresponding thyristor electronic unit using the already mentioned fiber-optic cables. For that purpose special high-voltage rated fiber-optic cables are used, whose range of transmission is limited, however. Thus, for example, it is not possible in the known arrangement to mount the transistor electronic unit on one of the frontal sides off the valve housing at the same level as the valve tower and transformers, because that would exceed the maximum range of transmission of the fiber-optic cables. Designers were thus forced to create compartments beneath the valve housing and to mount the thyristor electronic unit within those compartments to assure a short transmission path. Accordingly, it will be appreciated that it would be highly desirable to provide a more compact coupling arrangement, particularly of the semiconductor arrangement.

It is an object of this invention to provide a direct current coupling for connecting two asynchronous high-voltage power systems.

It is also an object of this invention to provide a coupling which has a compact semiconductor arrangement.

SUMMARY OF THE INVENTION

Briefly stated, in accordance with one aspect of the present invention, a d.c. tight coupling is provided for connecting two asynchronous high-voltage three-phase power systems. The coupling includes a three-phase full-wave static converter arrangement with static converter transformers and controllable semiconductors allocated to each of the networks to be connected and which are controlled by a central electronic control unit. This causes the input-side static converter to function as a rectifier and the output-side static converter as an inverter. The controllable semiconductors of a functional unit are arranged in a stack pattern and form matching converter towers connected on the d.c. side together at the same pole and on the three-phase side with the respective Wye and Delta connected secondary side of the static converter transformers. Each of the full-wave semiconductor subassemblies allocated to the four secondary sides of the static converter transformers form a static converter tower.

This invention reduces the surface requirements of the semiconductor towers by approximately one-third, while allowing all three phases of each secondary side to be routed to one single tower which eliminates the need for crisscrossing connection lines. In addition, it means that the edge length of the surface required by the static converter towers has been reduced to such a size that the thyristor electronic unit can be mounted on one of the frontal sides of the semiconductor housing at the same level as are the semi-conductor towers. This eliminates the need for the subcompartments of the static converter housing, thereby substantially reducing the construction costs.

BRIEF DESCRIPTION OF THE DRAWINGS

While the specification concludes with claims particularly pointing out and distinctly claiming the subject matter which is regarded as the invention, it is believed that the invention will be better understood from the following description of the preferred embodiment taken in conjunction with the accompanying drawings in which:

DESCRIPTION OF A PREFERRED EMBODIMENT

Figure 1:
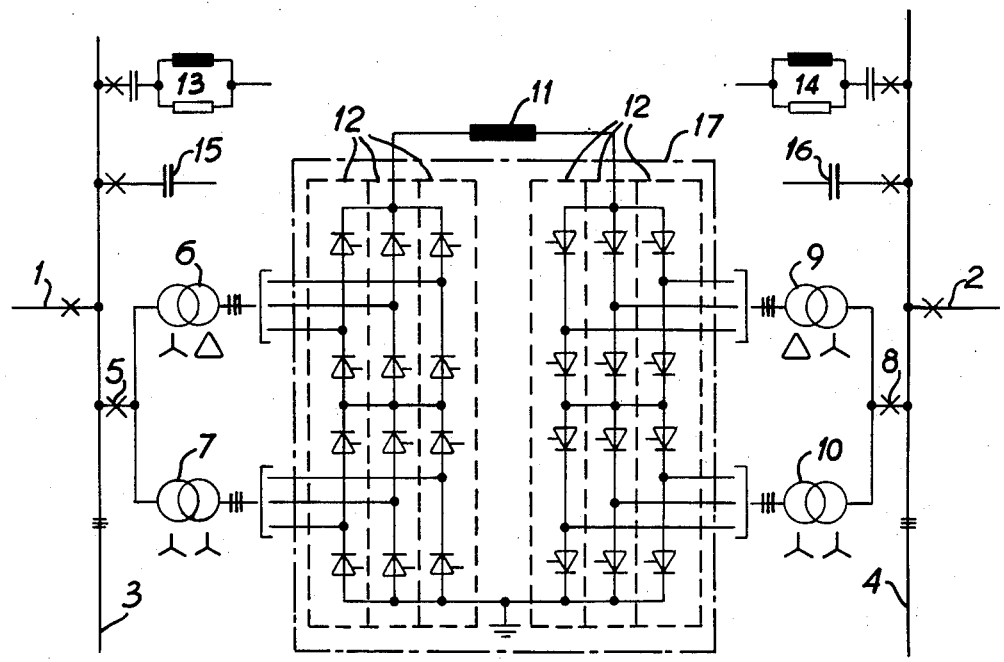
FIG. 1 is a schematic diagram of the high-voltage d.c. tight coupling shown connecting two asynchronous high-voltage power systems.

Referring to FIG. 1, the three-phase open-wire lines of the asynchronous three-phase power systems 1 and 2 which are to be connected are first connected to the three-phase bus bars 3,4 of the coupling unit. Bus bar 3 is connected by connecting lines 5 with the primary connections of the static converter transformers 6 and 7, and the bus bar 4 is connected by connecting lines 8 with the primary connections of static converter transformers 9 and 10. Of the two static converter transformers allocated to power system 1, the secondary side of transformer 6 is Delta-connected, and the secondary side of transformer 7 is Wye-connected. The same applies for static converter transformers 9 and 10 allocated to power system 2. Each secondary phase connection is connected in the known fashion to the three-phase connection of a three-phase full-wave rectifier, each of which is equipped with 12 thyristors. The circuitry is known and requires no further explanation. Both rectifier systems are directly connected to each other by the grounded negative poles of the d.c. voltage side and by smoothing reactor 11 on the positive pole side.

In the known coupling arrangement four of the series-connected thyristors of each of the three static converter branches of each full-wave rectifier are stacked above each other in four levels to form one so-called static converter tower 12 shown by broken lines in FIG. 1.

Due to the symmetric design of the coupling system and the use of thyristors in both full-wave rectifiers, one can select the power-flow direction by a corresponding control of the thyristors so that power either flows from system 1 to system 2 or vice versa. The energy flow direction can thus be selected using a transistor electronic control. The static converter transformers 6, 7 or 9, 10, on the one hand, have the task to transform the voltage of both three-phase systems to one suitable for the static converters, and on the other hand, to isolate the three-phase systems from the d.c. circuit. Smoothing reactor 11 serves, on the one hand, to reduce the d.c. ripples, but on the other hand to limit the short-circuit current in case of thyristor short-circuits. By the phase-gating control of the thyristors, harmonic waves are created which can lead to voltage distortions in the three-phase circuits and also cause interference with communications circuits. In addition, these harmonic waves produce an additional thermal load on transformers, capacitors and transmission lines which are designed for a sinusoidal current. It is thus necessary to remove the harmonic waves on the three-phase side by high-pass filters 13, 14. As on the d.c. voltage side only active power can be transmitted, the reactive power requirement on the three-phase side has to be generated by capacitor batteries 15, 16.

As FIG. 1 indicates, the combination of the four thyristors connected in series to form one tower 12 assumes that each tower is connected to one phase of the secondary side of the three-phase circuit of each of the static converter transformers allocated to a given power system. This results in a relatively expensive crossing of long and thus expansive connection cabling on the a.c. current side. In addition, the six static converter towers require a relatively large mounting surface which leads to the previously decribed problems when connecting the control cables to the thyristors.

Figure 2:
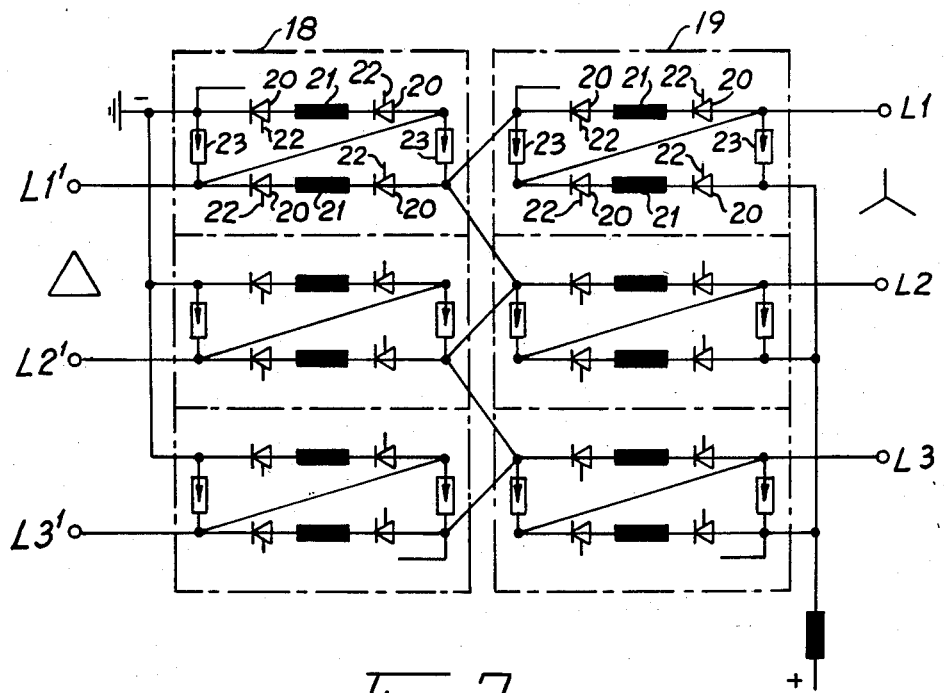
FIG. 2 is a schematic illustration of the thyristors of one power system assembled in two towers.
Figure 3:
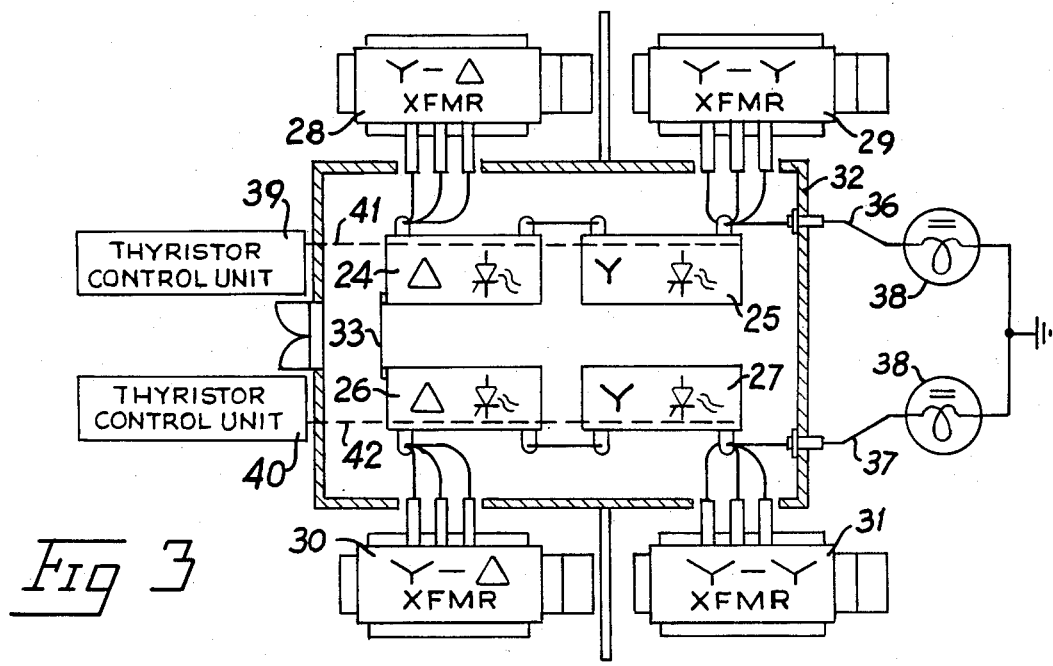
FIG. 3 is a simplified layout illustrating the static converter housing with static converter transformers, smoothing reactors and thyristor electronic control.

In this invention, therefore, the combination of the static converters to form static converter towers is designed differently. Specifically in this design, the four serially connected static converters of a full-wave rectifier assembly are not always assembled to form a tower; this design rather combines the groups connected in parallel and formed by two series connected thyristors which are allocated to each of the secondary sides of the static converter transformers. This arrangement is depicted schematically in FIG. 2. Wherein, the left tower 18 includes the static converter subassembly of the secondary Delta-side L1', L2', L3' of static converter transformer 6, and the right tower 19 includes that of the secondary Wye connection L1, L2, L3 of static converter transformer 7. Each of the static converters shown in FIG. 1 correspond, in FIG. 2, to two identical thyristors 20 wired in series with intervening reactors 21. The control connections 22 of the thyristors are connected to control lines (not shown) which connect the thyristors to a thyristor electronic unit. In addition, for each two serially-connected thyristors there is one control valve 23 connected in parallel to discharge excess voltage. FIG. 3 illustrates the entire coupling arrangement in schematic outline. The four static converter towers 24, 25, 26, and 27 are arranged in a rectangular pattern so that their three-phase connections always face the assigned static converter transformers 28, 29, 30, 31.

These transformers are located outside the static converter housing 32 which encloses the static converter towers. For that reason, relatively short non-crossing connecting lines can be used. In addition, the d.c. current buses 33, 34 and 35 connect the static converter towers together as well as the lines 36, 37 feeding the smoothing reactors 38 which are designed to assure the minimal possible length and thus the greatest possible efficiency.

Since the edge length of the longitudinal side of the static converter towers is now only two-thirds the length of that previously obtained for the six-tower arrangement, the thyristor electronic control units 39, 40 can easily be mounted at the same level as the towers and the transformers. The length of the fiber-optic connecting cables 41, 42 in this arrangement is markedly shorter than the maximum possible transmission length of such cables suitable for a high-voltage environment.

Figure 4:
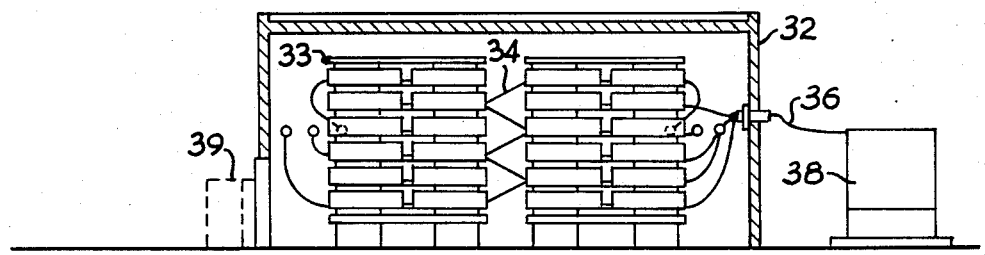
FIG. 4 is a longitudinal cross-sectional diagram of the static converter housing with the smoothing reactor and thyristor electronic control.
Figure 5:
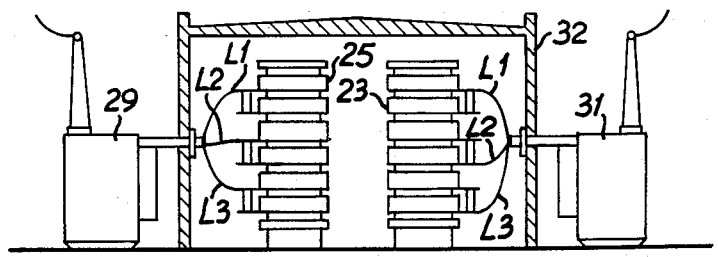
FIG. 5 is a longitudinal cross-sectional diagram, taken at a right angle to FIG. 4, of the static converter housing with the static converter transformers.

FIG. 4 illustrates the basic design configuration of the static converter columns in a longitudinal section of the static converter housing. This, once again, indicates success in designing the feed and connecting lines both on the three-phase side as well as on the d.c. side in a short and clearly defined fashion. This is also clearly seen from the cross-sectional view in FIG. 5.

As will be evident from the foregoing description, certain aspects of the invention are not limited to the particular details of the example illustrated, and it is therefore contemplated that other modifications or applications will occur to those skilled in the art. It is accordingly intended that the claims shall cover all such modifications and applications as do not depart from the true spirit and script of the invention.

What is claimed as new and desired to be secured by Letters Patent of the United States is:

1. A d.c. short coupling for connecting a first and a second asynchronous, high-voltage, three-phase, power network comprising:

a three-phase, full-wave static converter arrangement having a Wye-connected secondary static converter transformer, and a Delta-connected secondary static converter transformer and controllable semiconductors allocated to each of the networks to be connected by said short coupling;

said controllable semiconductors are controlled by a central electronic control unit so that a network-supplying power static converter assembly functions as a rectifier and a network-receiving-power static converter assembly functions as an inverter, and the controllable semiconductors of each functional assembly are arranged in a stack pattern forming matching static converter towers connected together on the d.c. power coupling side at the same voltage polarity, and on the three-phase, a.c. power side with respective Wye-connected secondary and Delta-connected secondary sides of the static converter transformers; and each of the two full-wave static converter arrangements has two full-wave controllable semiconductor subassemblies allocated to the Wye-connected and the Delta-connected secondary sides of the static converter transformers, each semiconductor subassembly forming a static converter tower, said four static converter towers are arranged in a rectangular pattern and assembled in such a manner that the static converter towers electrically connected to the secondary sides of the static converter transformers of one power network and the static converter towers electrically connected to the secondary sides of the static converter transformers are located next to each other, parallel to the static converter towers, and the static converter towers electrically connected to the Delta-connected secondary sides of both power networks and the static converter towers electrically connected to the Wye connected secondary sides of both power systems face each other.

2. A d.c. short coupling as set forth in claim 1, wherein the static converter towers, the static converter transformers and the electronic control for the controllable semiconductors are mounted on the same structural level.

* * * * *